(12) United States Patent
Teramae et al.

(10) Patent No.: US 7,211,861 B2
(45) Date of Patent: May 1, 2007

(54) INSULATED GATE SEMICONDUCTOR DEVICE

(75) Inventors: Satoshi Teramae, Kanagawa (JP); Shigeru Hasegawa, Fukuoka (JP); Hideaki Ninomiya, Kanagawa (JP); Masahiro Tanaka, Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/154,743

(22) Filed: Jun. 17, 2005

(65) Prior Publication Data

US 2005/0280078 A1    Dec. 22, 2005

(30) Foreign Application Priority Data

Jun. 18, 2004    (JP) .............................. 2004-181580

(51) Int. Cl.
*H01L 29/06*    (2006.01)
(52) U.S. Cl. ..................... 257/330; 257/331; 257/495; 257/496; 257/E29.027; 257/E29.197; 257/E29.201
(58) Field of Classification Search ................. 257/330
See application file for complete search history.

(56) References Cited

U.S. PATENT DOCUMENTS

| | | | |
|---|---|---|---|
| 6,153,896 A * | 11/2000 | Omura et al. ............... | 257/139 |
| 6,445,048 B1 | 9/2002 | Pfirsch | |
| 6,566,691 B1 | 5/2003 | Inoue et al. | |
| 6,667,515 B2 * | 12/2003 | Inoue ......................... | 257/341 |
| 6,737,705 B2 * | 5/2004 | Momota et al. ............ | 257/330 |
| 6,747,295 B2 | 6/2004 | Inoue et al. | |
| 6,754,264 B1 * | 6/2004 | Ben Rached et al. ....... | 375/232 |
| 6,765,239 B2 * | 7/2004 | Hiyoshi et al. ............. | 257/107 |
| 6,777,743 B2 * | 8/2004 | Hasegawa ................... | 257/329 |

(Continued)

FOREIGN PATENT DOCUMENTS

EP    0 813 250    12/1997

(Continued)

OTHER PUBLICATIONS

U.S. Appl. No. 11/154,743, filed Jun. 17, 2005, Teramae, et al.

(Continued)

*Primary Examiner*—Leonardo Andujaf
*Assistant Examiner*—Eduardo A. Rodela
(74) *Attorney, Agent, or Firm*—Oblon, Spivak, McClelland, Maier & Neustadt, P.C.

(57) ABSTRACT

An insulated gate semiconductor device, includes an isolating structure shaped in a circulating section along the periphery of a semiconductor substrate to isolate that part from an inside device region, a peripheral diffusion region of the semiconductor substrate located outside the isolating structure, a plurality of cell structures defined in the inside device region and divided in segments by insulated trench-shaped gates to have a base region covered with an emitter region in its upper surface, a collector region, and an emitter electrode electrically connected to the emitter region and the base region, a dummy base region contiguous to the cell structures and configured as a base region that has its upper surface left without the emitter region connected to the emitter electrode, an inner region defined in and insulated from the dummy base region, and a connection part to electrically connect the inner region to the emitter electrode.

10 Claims, 9 Drawing Sheets

U.S. PATENT DOCUMENTS

| | | | |
|---|---|---|---|
| 6,809,349 B2 * | 10/2004 | Yamaguchi et al. | 257/133 |
| 2004/0016979 A1 * | 1/2004 | Kawano et al. | 257/401 |
| 2004/0089866 A1 * | 5/2004 | Hattori et al. | 257/279 |
| 2004/0238884 A1 * | 12/2004 | Tanaka et al. | 257/341 |
| 2004/0238894 A1 * | 12/2004 | Furuta | 257/355 |

FOREIGN PATENT DOCUMENTS

| | | |
|---|---|---|
| EP | 1 032 047 | 8/2000 |
| JP | 2001-168333 | 6/2001 |
| JP | 2004-153112 | 5/2004 |

OTHER PUBLICATIONS

U.S. Appl. No. 11/384,260, filed Mar. 21, 2006, Ninomiya, et al.

* cited by examiner

INSULATED GATE SEMICONDUCTOR DEVICE

CROSS REFERENCE TO THE RELATED APPLICATIONS

This application is based on upon and claims the benefit of priority from the prior Japanese Patent Application No. 2004-181580, filed on Jun. 18, 2004; the entire contents of which are incorporated herein by reference.

BACKGROUND OF THE INVENTION

The present invention relates to an insulated gate semiconductor device, and more particularly, to an insulated gate bipolar transistor (IGBT) provided with a trench gate and a device structure of the same.

Typical insulated gate transistors include IGBTs broadly used in the art, and the improvement having a new feature of accumulating electrons below the gate has been developed in the name of injection enhanced gate transistor (IEGT), which can implement greater electric power and has become more common in the art.

In the prior art insulated gate semiconductor device, a ring-shaped diffusion region in the outer peripheral part and a diffusion layer underlying a gate interconnection are formed in connection with a base diffusion layer in a cell region.

In such an arrangement, however, a semiconductor device, such as the IEGT, of particularly enhanced withstand voltage has its cell region store an increased amount of cumulative carriers and reduce negative capacity, and therefore, it employs trench gates for gate electrodes to define a floating dummy base region without contact with an emitter electrode in a base region between the trench gates.

The negative capacity may be disadvantageous in that, unless a potential at a p-type dummy base layer in a dummy cell region is completely floating, there arises a problem of overshooting of gate-emitter voltage Vge. More specifically, even if the device design is deliberate in making the potential at the p-type dummy base layer floating, a parasitic structure (e.g., a partial connection with a cell edge and a terminating portion of the junction) permits parasitic resistance to fix the potential at approximately zero level during the OFF-time of the transistor, and succeedingly turning the transistor ON to cause the gate-emitter voltage Vge to reach threshold voltage Vth results in the potential at the p-type dummy base layer rapidly rising simultaneous with the injection of holes, which eventually brings about a phenomenon of overshooting of the gate-emitter voltage Vge.

The provision of the dummy base region isolated from the emitter layer urges carriers to be injected so as to reduce the ON-voltage, but there still arises a disadvantage that carriers remain in the dummy base region on switching the semiconductor device on, which adversely reduces the breakdown durability.

While the current is being cut off, the device must be drained by eliminating the carriers remaining therein, and thus, carriers in the cell region are removed through the emitter electrode while the carriers remaining in the peripheral regions of the device are eliminated through the ring-shaped diffusion region in the outer peripheral part and then through the base diffusion layer in the cell region. Completely isolating the ring-shaped diffusion region in the outer peripheral part and the diffusion layer underlying the gate interconnection from the base diffusion layer in the cell region, however, a device draining route disappears which urges the carriers to flow out of the outer peripheral part during the current cutoff, and this is prone to lead to the reduction of the cutoff durability.

SUMMARY OF THE INVENTION

According to one aspect of the present invention, there is provided an insulated gate semiconductor device, comprising:

an isolating structure shaped in a circulating section along the periphery of a semiconductor substrate so as to isolate that part from an inside device region, a peripheral diffusion region of the semiconductor substrate located outside the isolating structure, a plurality of cell structures defined in the device region and divided in segments by insulated trench-shaped gates so as to have a base region covered with an emitter region in its upper surface, a collector region, and an emitter electrode electrically connected to the emitter region and the base region, a dummy base region contiguous to the cell structures and configured as a base region that has its upper surface left without the emitter region connected to the emitter electrode, and a connection part to electrically connect the peripheral diffusion region to the emitter electrode.

According to another aspect of the present invention, there is provided an insulated gate semiconductor device, comprising:

an isolating structure shaped in a circulating section along the periphery of a semiconductor substrate so as to isolate that part from an inside device region, a peripheral diffusion region of the semiconductor substrate located outside the isolating structure, a plurality of cell structures defined in a device region of the semiconductor substrate and divided in segments by insulated trench-shaped gates so as to have a base region covered with an emitter region in its upper surface, a collector region, and an emitter electrode electrically connected to the emitter region and the base region, a dummy base region contiguous to the cell structures and configured as a base region that has its upper surface left without the emitter region connected to the emitter electrode, an inner diffusion region defined in the dummy base region and insulated from the dummy base region, and a connection part to electrically connect the inner diffusion region to the emitter electrode.

DETAILED DESCRIPTION OF THE INVENTION

With reference to the accompanying drawings, embodiments of the present invention will now be described.

Figure 1:
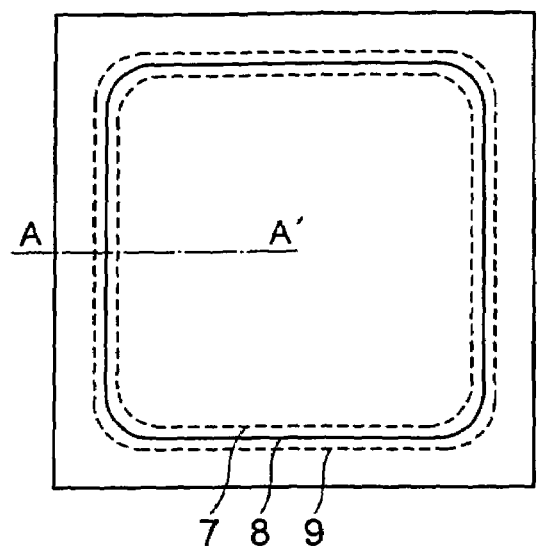
FIG. 1 is a plan view illustrating an insulate gate semiconductor device according to the present invention.
Figure 2:
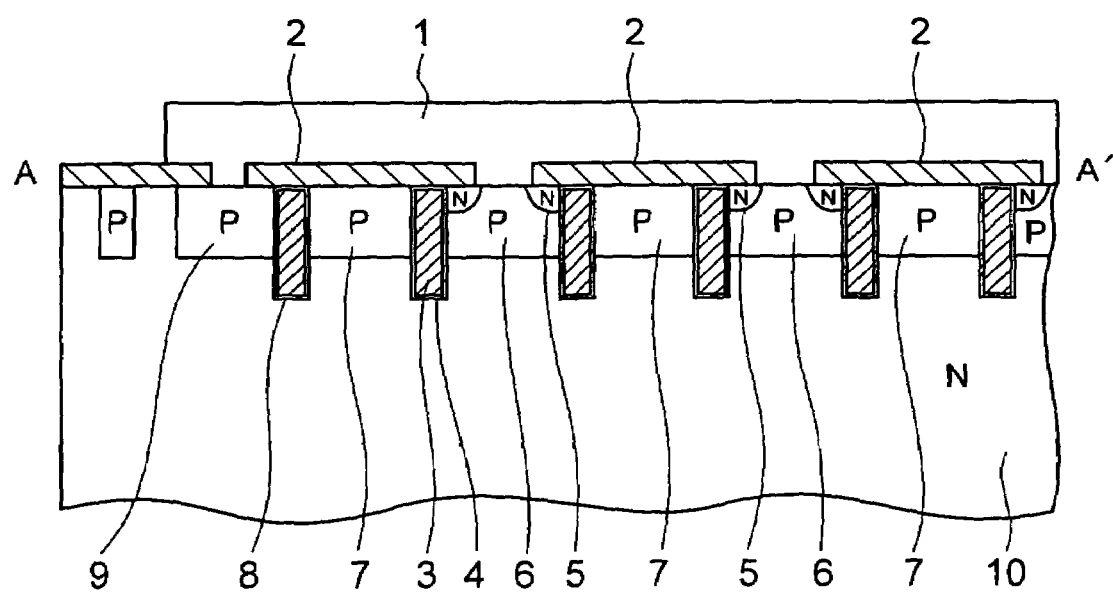
FIG. 2 is an enlarged sectional view taken along the line A–A' of FIG. 1.

FIG. 1 is a plan view of an insulated gate semiconductor according to the present invention while FIG. 2 is an enlarged sectional view taken along the line A–A' of FIG. 1.

As depicted in the drawings, a trench 8 extends around the periphery of an n-type substrate 10 to isolate an outer peripheral ring-shaped area from a device area, and an innermost terminating portion 9 of a p-type diffusion region is positioned outside the isolating trench 8 while a dummy base region 7 serving as the floating p-type diffusion region is defined inside the isolating trench 8.

FIG. 2 depicts a cross-sectional configuration of the device area where a p-type base region 6 and the dummy base region 7 are alternately defined by trench gate electrodes 3 coated with insulation film 4. In the upper surface of the base region 6 contiguous to the gate electrodes 3, an n-type emitter region 5 is formed. The dummy base region means a base region without an emitter region in connection with the emitter electrodes. Interlayer insulation film 2 overlies the dummy base region 7 and the gate electrodes 3, and an emitter electrode 1 is formed over the entire upper surface of the device.

EXAMPLES

Embodiment 1

A first embodiment of an insulated gate semiconductor device according to the present invention will be described below. This embodiment is suitable to draining carriers from the outer peripheral diffusion region.

Example 1

Figure 3:
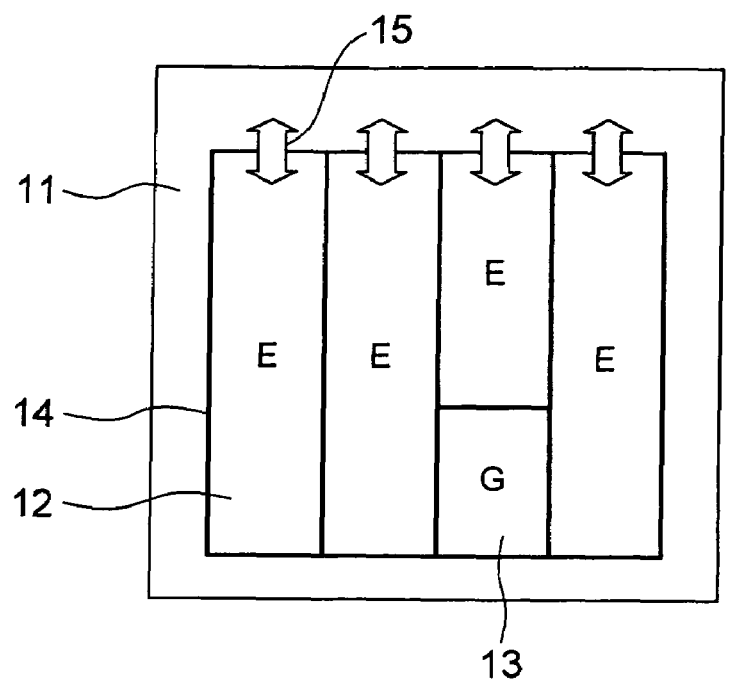
FIG. 3 is a schematic plan view illustrating a first example of a first embodiment of the present invention.

FIG. 3 is a schematic plan view showing a first example of the first embodiment of the present invention, seen from a position above the semiconductor device. This semiconductor device may be a high power IGBT of about 15 mm in each side of the rectangle.

As can be seen, a ring-shaped electrode 11 is formed in the outer peripheral portion of the device, and inside of the same, emitter electrodes 12 and a gate electrode 13 are formed. FIG. 3 specifically depicts four columns of the emitter electrodes 12 juxtaposed one another and the gate electrode positioned in the lower half of the second rightmost column. Thick line in the figure represents metal interconnection 14 overlying gate interconnection so as to reduce resistance. Also, in this embodiment, additional metal interconnection 15 is provided in the upper surface of the emitter electrode 12 in each column in continuously connection with the outer peripheral ring-shaped electrode 11 and formed by the same manufacturing process as them.

Figure 4:
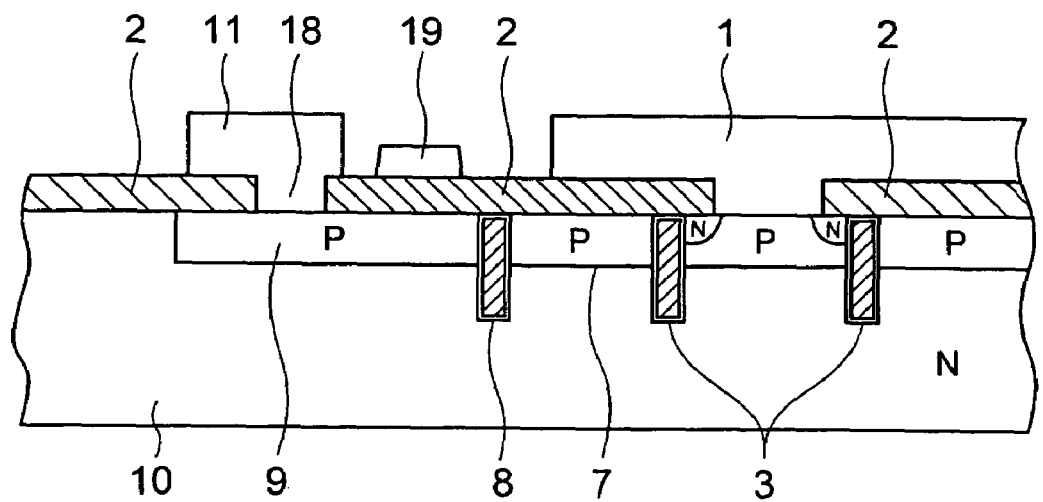
FIG. 4 is a partial sectional view showing a device with an exemplary interconnection arrangement.
Figure 5:
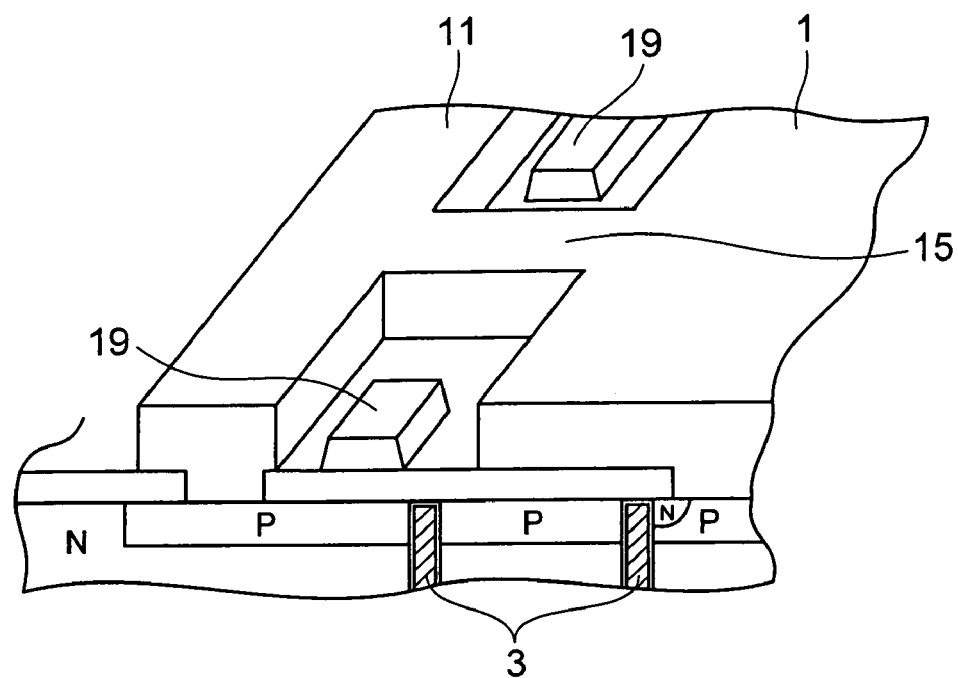
FIG. 5 is a perspective view of FIG. 4.
Figure 6:
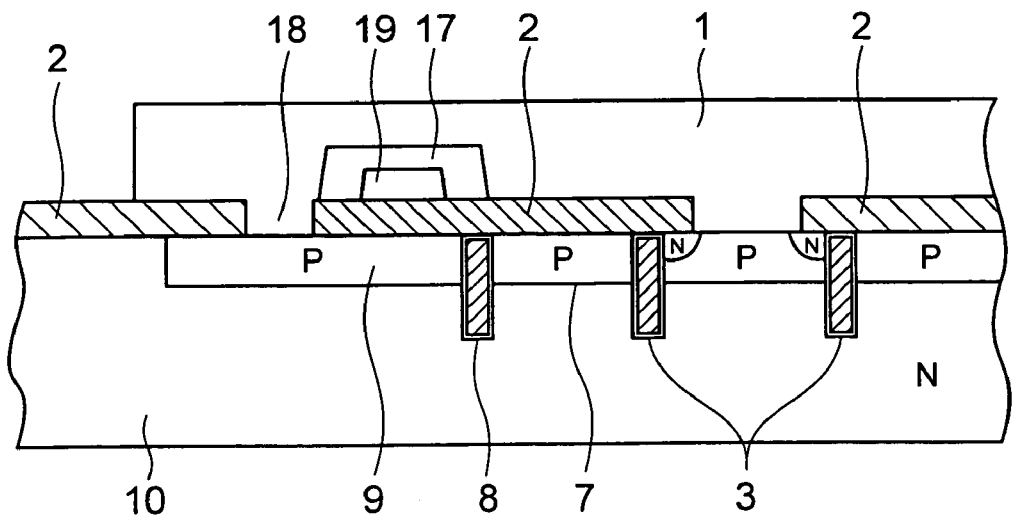
FIG. 6 is a sectional view showing the device with another exemplary interconnection arrangement.

FIGS. 4 to 6 illustrate the connections of the emitter electrodes with the outer peripheral ring-shaped electrode.

FIG. 4 is a sectional view of an interconnection configuration, illustrating the interconnection is interrupted at a point 15 of the interconnection while FIG. 5 is a perspective view of the interconnection configuration. As will be recognized in FIG. 4, the innermost terminating portion 9 of the ring-shaped diffusion region is positioned outside the isolating trench 8, and partially above the portion 9, a gate electrode 19 is defined with the intervening insulation film 2 between them. The gate electrode 19 is, as shown in FIG. 5, interrupted at the point of the interconnection where the metal interconnection 15 is laid to connect the emitter electrode 1 inside the isolating trench with the outer peripheral ring-shaped electrode 11 outside the trench.

The ring-shaped diffusion region 9 and the outer peripheral ring-shaped electrode 11 outside the isolating trench 8 are connected to each other via a through-hole 18 defined in the insulation film 2.

Configured in this way, the device can drain carriers around the device through the outer peripheral ring-shaped electrode 11, the metal interconnection 15, and the emitter electrode, and resultantly, the cutoff durability of the device can be enhanced.

FIG. 6 is a sectional view showing another example of the connection of the emitter electrode with the outer peripheral ring-shaped electrode. In this example, as will be apparent in contrast with that in FIG. 4, the gate electrode 19 is covered with insulation film 17, and thus, there is no need of separating the gate electrode 19 into segments. Instead, the whole gate electrodes are overlaid by the emitter electrode 1.

In this embodiment, some of the required manufacturing steps like the etching can be omitted.

Example 2

Figure 7:
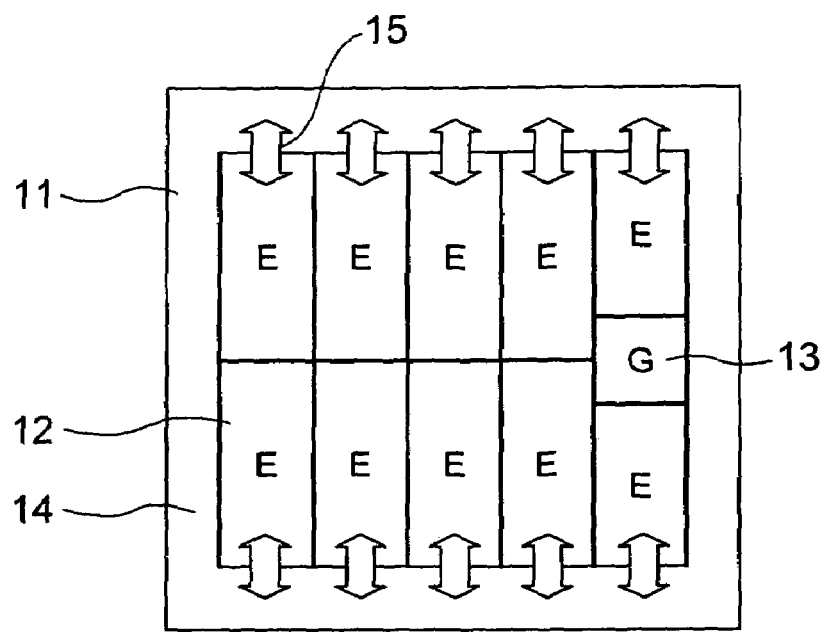
FIG. 7 is a plan view illustrating a second example of the first embodiment of the present invention.

FIG. 7 depicts a second example of the first embodiment of the present invention where there are five columns of the emitter electrodes 12, showing the one in each column divided into upper and lower segments. In the rightmost column, the gate electrode 13 is interposed between the upper and lower segments of the emitter electrode.

Also, in this example, the metal interconnection 15 is provided between all the emitter electrodes 12 and the outer peripheral ring-shaped electrode 11, and similar to the previous example (Embodiment 1.1), the carriers in the outer peripheral region can be drained during the current cutoff. Comparing with the previous example, however, this example has the increased number of conductive points, and thus, it is suitable to an application of the semiconductor device having a larger area durable to particularly greater current.

Example 3

Figure 8:
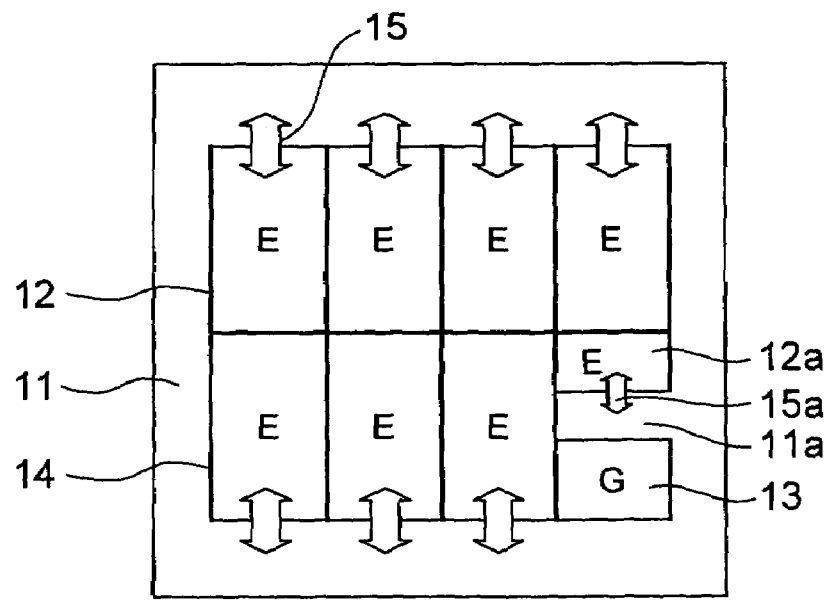
FIG. 8 is a plan view illustrating a third example of the first embodiment of the present invention.

FIG. 8 is a plan view showing a third example of the first embodiment according to the present invention. Although it is similar to that of FIG. 4 in that four columns of the emitter electrodes 12 are divided into upper and lower segments, the arrangement includes the gate electrode 13 positioned at the lower corner of the rightmost column, with part 11a of the outer peripheral ring-shaped electrode 11 extending in an area between the gate electrode 13 and the overlying lower segment 12a of the emitter electrode 12. There is also provided metal interconnection 15a between the extended electrode part 11a and the emitter segment 12a.

In this example, the gate electrode 13 is located at the corner, and this arrangement is suitable to some device designed to have its gate electrode in the very position.

Example 4

Figure 9:
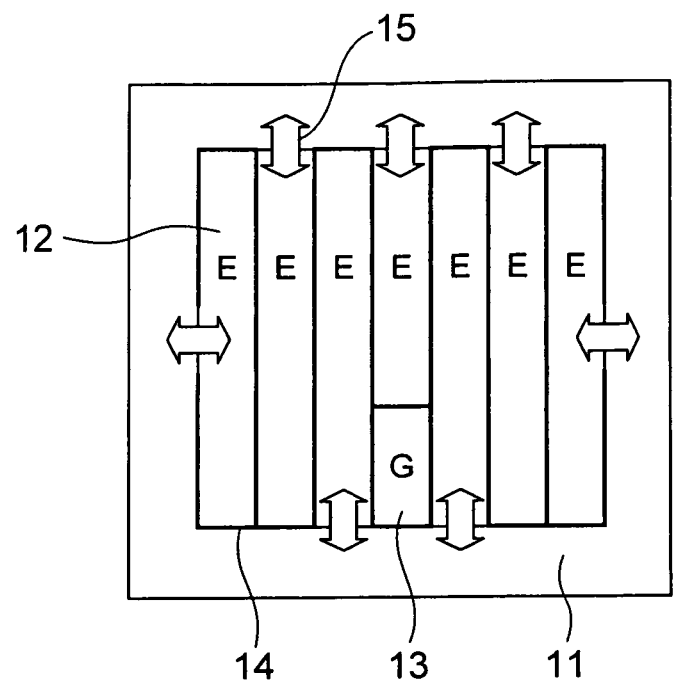
FIG. 9 is a plan view illustrating a fourth example of the first embodiment of the present invention.

FIG. 9 is a plan view of a fourth example of the first embodiment according to the present invention, showing seven columns of the emitter electrodes 12 along with the gate electrode 13 in the lower portion of the fourth or center column. The emitter electrodes and the surrounding outer peripheral ring-shaped electrode 11 are connected to each other by means of metal interconnection provided in one of the lateral sides for the leftmost and rightmost emitter electrodes, in the upper end for those in the columns of even numbers, and in the lower end for those in the columns of odd numbers other than the leftmost and rightmost ones.

In this example, the metal interconnection is provided, as a whole, in alternately upper and lower ends of the electrodes, and this arrangement allows not so tight a formation in the interconnection area during the manufacturing process.

Embodiment 2

The first embodiment described so far is suitable to the carrier drainage out of the outer peripheral diffusion region, and another embodiment as described below is suitable to the carrier drainage out of some other region inside the device.

Example 5

Figure 10:
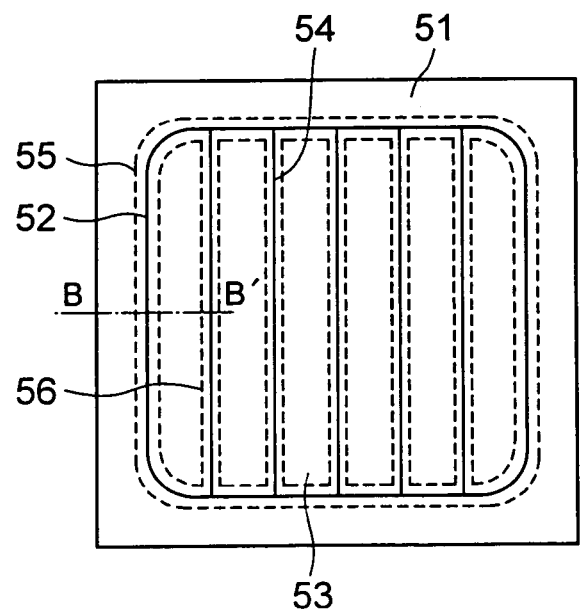
FIG. 10 is a plan view of a common IGBT structure among examples of a second embodiment of the present invention.

FIG. 10 is a plan view showing a common IGBT structure among examples of the second embodiment of the invention as detailed below, and this structure is similar to the prior art embodiment in that it includes a circulating trench-like area 52 isolating an outer peripheral portion 51 from an inner peripheral portion. The improvement of this embodiment is that such a trench-like isolating region is provided not only in the outer periphery of the emitter cell but also in the inside of the emitter cell and that there are linear trench-like isolating regions 54 so as to isolate adjacent columns of emitter regions 53 from each other. Additionally, as described in conjunction with FIG. 1, an innermost terminating portion 55 is located outside and right next to the isolating region while a dummy base region 56 is formed inside the same. The dummy base region 56 also extends along the isolating regions between the adjacent ones of the emitter regions. The peripheral portion of the emitter cell has an innermost terminating portion voltage, and the terminating portion is equivalent in potential to the emitter electrode.

Figure 11:
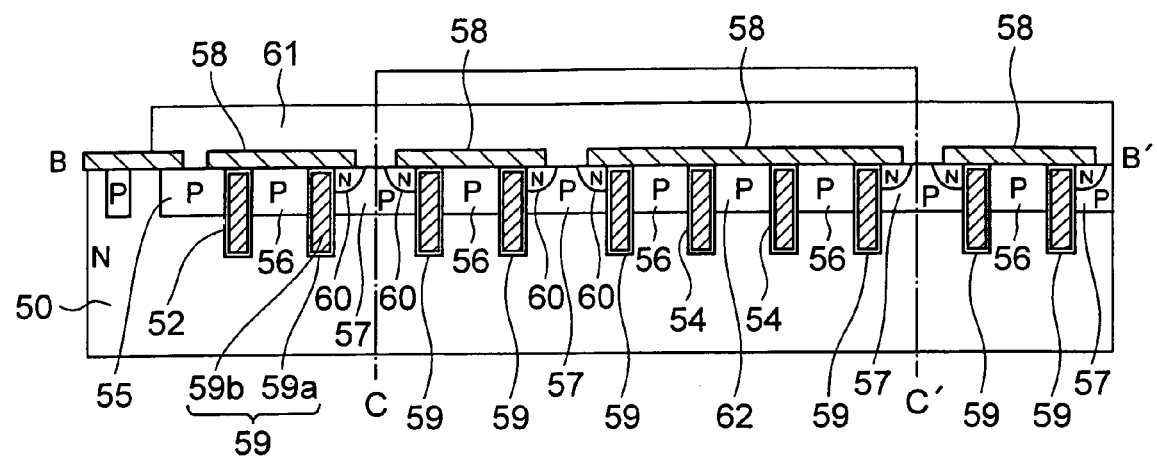
FIG. 11 is a sectional view showing the IGBT structure of a first example of the second embodiment of the present invention.

FIG. 11 is a sectional view taken along the line B–B' of FIG. 10, illustrating the first example of the second embodiment of the IGBT structure according to the present invention.

There are many trenches which respectively serve as isolating trenches 52 and 54, and as trench gate electrodes 59. In the surface of the substrate, an interlayer insulation film 58 is deposited over the trenches. In the case that no interlayer insulation film lies over zones defined between the adjacent trenches but instead an emitter electrode 61 does, these trenches are identified with the trench gate electrodes 59, and between the adjacent ones of them, base regions 57 lie along with emitter regions 60 in their respective surfaces, which are formed as n-type impurity diffused regions.

The regions defined between the adjacent trench gates with the overlying interlayer insulation film, are identified with p-type dummy base regions 56. Regions defined between the trench gate electrodes and the isolating trenches 54 below the interlayer insulation film 58 are also the dummy base regions 56. A region between the isolating trenches 54 is a p-type carrier drainage diffusion layer 62.

Figure 12:
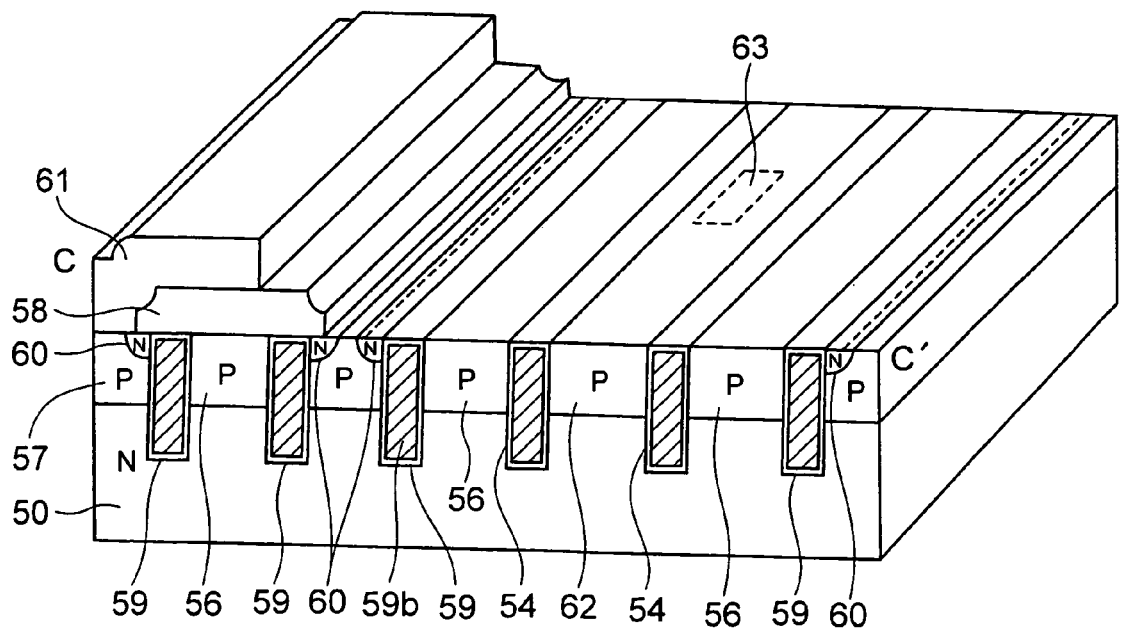
FIG. 12 is a partially cut-away perspective view showing depthwise dimensions, taken along the line C–C' of FIG. 11.

FIG. 12 is a partially cut-away perspective view illustrating depthwise dimensions along the line C–C' of FIG. 11. In this figure, the interlayer insulation layer 58 over the rightmost to the fourth rightmost trenches and most of the emitter electrode 61 are omitted. The p-type carrier drainage diffusion layer 62 is connected to the emitter electrode 61 to be equivalent in potential through contact holes and interconnection (both of them are not shown) provided in the interlayer insulation film 58 underlying the carrier drainage diffusion layer 58, and the contact holes are define in a contact region 63 of the interlayer insulation film as denoted by broken line in FIG. 12. This structural manner is simply depicted in FIG. 13.

Configured in this manner, the device is drained by eliminating the remaining carriers through the p-type diffusion layer 62 inside the emitter cell to the emitter electrode upon switching the device on, and no cumulative carrier in the device improves an enhancement of the breakdown durability of the device.

Figure 13:
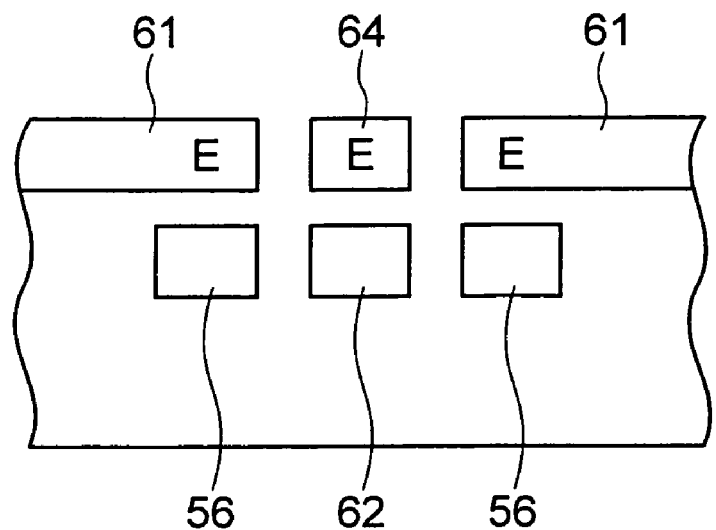
FIG. 13 is a simplified diagram of a carrier eliminating diffusion layer relative to interconnection.
Figure 14:
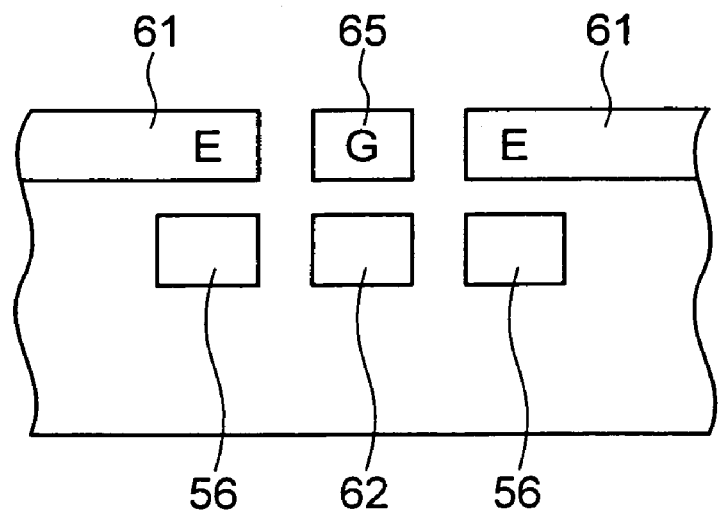
FIG. 14 is a simplified diagram similar to FIG. 13.

In FIG. 13, the carrier drainage diffusion layer 62 is linked to the interconnection 64 connected to the emitter electrode 61, but instead, as similarly simplified in a structural depictions in FIG. 14, the diffusion layer may be linked to a gate electrode 65 isolated from the emitter electrode 61. This is because such an arrangement is suitable to the structure provided with the carrier drainage diffusion layer 62 for collecting the carriers since the gate electrode cannot coexist with underlying active layer and has a relatively great width as long as 100 μm.

Embodiment 6

Figure 15:
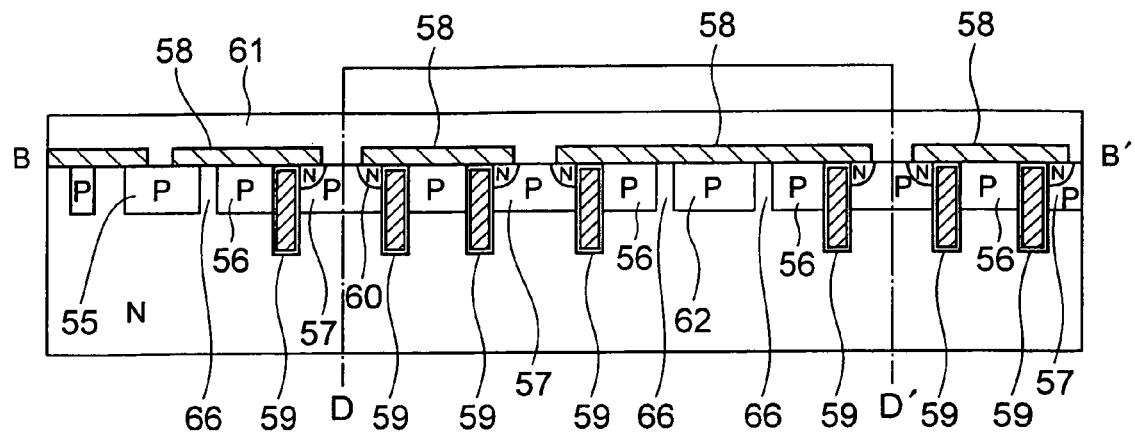
FIG. 15 is a sectional view showing a second example of the device according to the present invention.
Figure 16:
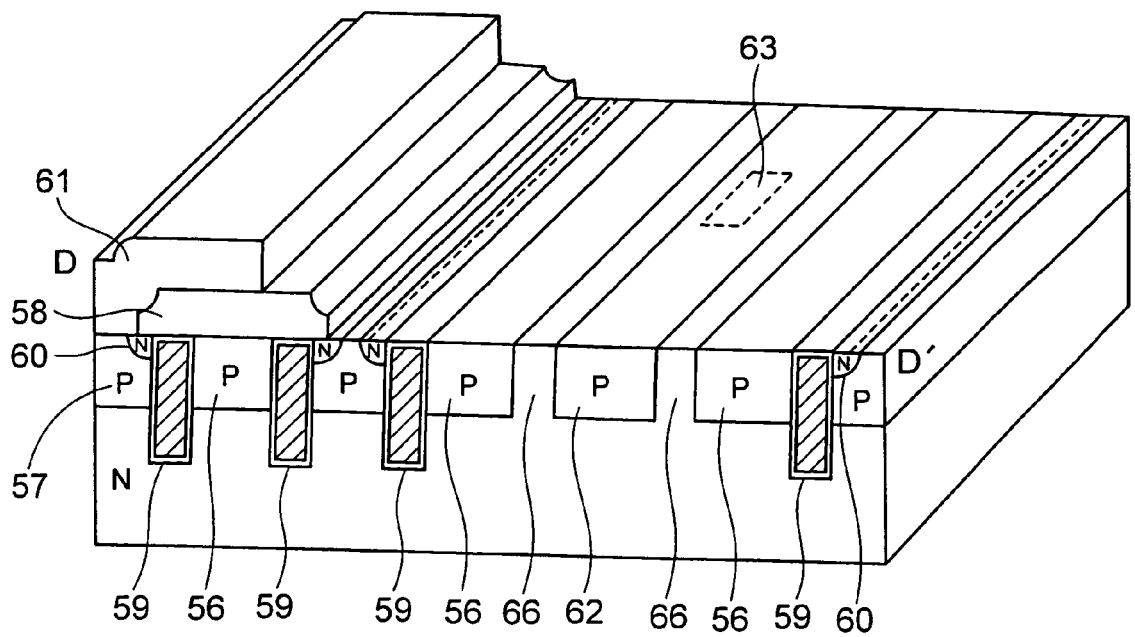
FIG. 16 is a sectional view taken along the line D–D' of FIG. 15.

FIG. 15 is a sectional view taken along the line B–B' of FIG. 10 similar to FIG. 11, showing a second example of the device that is drained by eliminating the carriers from some region inside the device. FIG. 16 is a sectional view taken along the line D–D' of FIG. 15. In these figures, like reference numerals denote the same components as those in FIGS. 11 and 12.

In this example, the isolating regions 52 and 54 are omitted although included in the example shown in FIGS. 11 and 12, and alternatively, a diffusion layer 66 serving as an n-type impurity diffused layer, for instance, is used to isolate the components.

The only difference from the previous one is the arrangement of the isolated regions, and the eventual features and effects of this example are totally similar to those in the first example; that is, the device is drained by eliminating the remaining carriers through the p-type diffusion layer inside the emitter cell to the emitter electrode upon switching the device on, and the absence of the cumulative carrier in the device improves an enhancement of the breakdown durability of the device.

Embodiment 7

Figure 17:
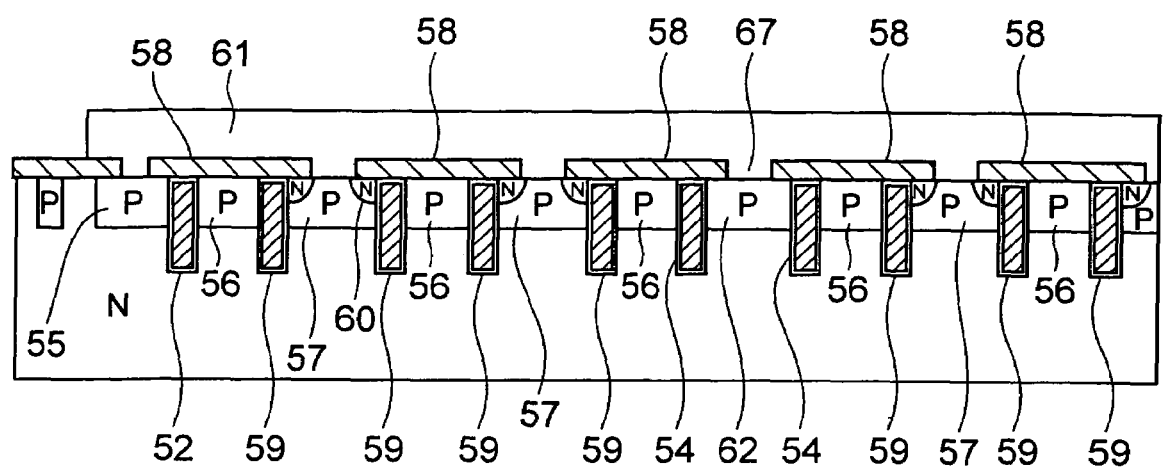
FIG. 17 is a sectional view illustrating a structure of a third example of the second embodiment of the present invention.

FIG. 17 is a sectional view taken along the line B–B7 of FIG. 10, showing a third example of the second embodiment of the present invention.

Although the aforementioned second and third examples commonly drain the device by eliminating the remaining carriers through the p-type diffusion layer and the interconnection, an emitter electrode 67 is provided in this embodiment so as to be in direct contact with the carrier drainage p-type diffusion layer 62.

In this embodiment, similarly, the carriers remaining in the device can be efficiently eliminated, but unlike the first and second example, the device can be drained by eliminating the remaining carriers from the carrier drainage p-type diffusion layer directly to the emitter electrode without the intervening interconnection, which attains a greater draining performance, compared with the first and second examples.

The first and second embodiments of the present invention as mentioned above are applicable independent of each other, and both of the embodiments may be incorporated in a single application.

What is claimed is:

1. An insulated gate semiconductor device comprising:
an isolating structure shaped in a circulating section along the periphery of a semiconductor substrate so as to isolate that part from an inside device region,
a peripheral diffusion region of the semiconductor substrate located outside the isolating structure,
a plurality of cell structures defined in the device region and divided in segments by insulated trench-shaped gates so as to have a base region covered with an emitter region in its upper surface, a collector region, and an emitter electrode electrically connected to the emitter region and the base region,
a dummy base region contiguous to the cell structures and configured as a base region that has its upper surface left without the emitter region connected to the emitter electrode, and
a connection part to electrically connect the peripheral diffusion region to the emitter electrode,
wherein
said emitter electrode is divided in segments of two rows and a plurality of columns, and said connection parts are provided at an end of said segments, and
wherein a gate electrode is disposed at a corner of either of the outermost columns, the peripheral diffusion region extending between the gate electrode and one of the divided emitter electrode in the column that the corner belongs to, and the connection part is provided between the extended peripheral diffusion region and one of the divided emitter electrode in the column.

2. An insulated gate semiconductor device comprising:
an isolating structure shaped in a circulating section along the periphery of a semiconductor substrate so as to isolate that part from an inside device region,
a peripheral diffusion region of the semiconductor substrate located outside the isolating structure.
a plurality of cell structures defined in the device region and divided in segments by insulated trench-shaped gates so as to have a base region covered with an emitter region in its upper surface, a collector region, and an emitter electrode electrically connected to the emitter region and the base region,
a dummy base region contiguous to the cell structures and configured as a base region that has its upper surface left without the emitter region connected to the emitter electrode, and
a connection part to electrically connect the peripheral diffusion region to the emitter electrode,
wherein said emitter electrode is divided in a plurality of colunm segments, said connection part is provided at the center of the outermost column segments and for the other column segments, said connection part is provided at uppermost and lowermost positions alternating for columns.

3. An insulated gate semiconductor device, comprising:
an isolating structure shaped in a circulating section along the periphery of a semiconductor substrate so as to isolate that part from an inside device region,
a peripheral diffusion region of the semiconductor substrate located outside the isolating structure,
a plurality of cell structures defined in the inside device region of the semiconductor substrate and divided in segments by insulated trench-shaped gates so as to have a base region covered with an emitter region in its upper surface, a collector region, and an emitter electrode electrically connected to the emitter region and the base region,
a dummy base region contiguous to the cell structures and configured as a base region that has its upper surface left without the emitter region connected to the emitter electrode,
an inner region defined in the dummy base region and insulated from the dummy base region, and
a first connection part to electrically connect the inner region to the emitter electrode.

4. The insulated gate semiconductor device according to claim 3, further comprising:
a second connection part to electrically connect the peripheral diffusion region to the emitter electrode.

5. The insulated gate semiconductor device according to claim 3, wherein said region and said dummy base region are insulated by an insulating trench gate.

6. The insulated gate semiconductor device according to claim 3, wherein said inner region and said dummy base region are insulated by a diffusion region having an opposite conductivity to that of the dummy base region and the inner region.

7. The insulated gate semiconductor device according to claim 3, wherein said emitter electrode and said inner region are connected through a contact hole formed in an insulating film formed on said inner region and through an interconnection.

8. The insulated gate semiconductor device according to claim 3, wherein said emitter electrode and said inner region are directly connected.

9. An insulated gate semiconductor device, comprising:
an isolating structure shaped in a circulating section along the periphery of a semiconductor substrate so as to isolate that part from an inside device region, a plurality of cell structures defined in the inside device region of the semiconductor substrate and divided in segments by insulated trench-shaped gates so as to have a base region covered with an emitter region in its upper surface, a collector region, and an emitter electrode electrically connected to the emitter region and the base region, a dummy base region contiguous to the cell structures and configured as a base region without the emitter region in its upper surface, an inner region defined in the dummy base region and insulated from the dummy base region, and a connection part to electrically connect the inner region to a gate interconnection layer connected to the trench-shaped gates.

10. The insulated gate semiconductor device according to claim 9, wherein said connection part is a contact hole formed in an insulating film formed on said inner region.

* * * * *